United States Patent
Cheng et al.

(10) Patent No.: US 11,164,940 B2
(45) Date of Patent: Nov. 2, 2021

(54) METHOD OF FORMING III-V ON INSULATOR STRUCTURE ON SEMICONDUCTOR SUBSTRATE

(71) Applicant: INTERNATIONAL BUSINESS MACHINES CORPORATION, Armonk, NY (US)

(72) Inventors: Kangguo Cheng, Albany, NY (US); Xin Miao, Albany, NY (US); Wenyu Xu, Albany, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/785,743

(22) Filed: Feb. 10, 2020

(65) Prior Publication Data

US 2020/0176558 A1 Jun. 4, 2020

Related U.S. Application Data

(62) Division of application No. 15/836,206, filed on Dec. 8, 2017, now Pat. No. 10,665,666.

(51) Int. Cl.
*H01L 29/20* (2006.01)
*H01L 29/78* (2006.01)
(Continued)

(52) U.S. Cl.
CPC .... *H01L 29/0607* (2013.01); *H01L 21/02614* (2013.01); *H01L 21/823431* (2013.01);
(Continued)

(58) Field of Classification Search
CPC ..... H01L 21/823431; H01L 21/823821; H01L 27/0886; H01L 29/41791; H01L 29/66795;
(Continued)

(56) References Cited

U.S. PATENT DOCUMENTS

| | | |
|---|---|---|
| 8,624,326 B2 | 1/2014 | Chen et al. |
| 9,058,987 B2 | 6/2015 | Cheng et al. |
| 9,142,400 B1 * | 9/2015 | Brueck ............ H01L 21/02107 |

(Continued)

OTHER PUBLICATIONS

H. Gebretsadik, K. Kamath, W. Zhou, and P. Bhattacharya, "Lateral oxidation of InAlAs in InP-based heterostructures for long wavelength vertical cavity surface emitting laser applications," Appl. Phys. Lett., vol. 72, No. 2, pp. 135-137, 1998.

(Continued)

*Primary Examiner* — Mary A Wilczewski
(74) *Attorney, Agent, or Firm* — F. Chau & Associates, LLC (57) ABSTRACT

A method of forming a semiconductor structure is provided. Trenches are formed in a first dielectric layer having a first height on a substrate. First III-V semiconductor patterns including aluminum are formed in the trenches to a second height lower than the first height. Second III-V semiconductor patterns are formed on the first III-V semiconductor patterns to a third height not higher than the first height to form fins including the first and second III-V semiconductor patterns. The first dielectric layer is completely removed to expose the fins. Selective oxidation is performed to oxidize the first III-V semiconductor patterns to form oxidized first III-V semiconductor patterns. Fin patterning is performed. A second dielectric layer is formed to cover the fins. The second dielectric layer is recessed to a level not higher than top surfaces of the oxidized first III-V semiconductor patterns. The semiconductor structure is also provided.

8 Claims, 8 Drawing Sheets

(51) Int. Cl.

| | | |
|---|---|---|
| *H01L 21/8234* | (2006.01) | |
| *H01L 29/06* | (2006.01) | |
| *H01L 29/10* | (2006.01) | |
| *H01L 29/417* | (2006.01) | |
| *H01L 29/66* | (2006.01) | |
| *H01L 21/02* | (2006.01) | |
| *H01L 21/84* | (2006.01) | |
| *H01L 29/786* | (2006.01) | |
| *H01L 27/088* | (2006.01) | |
| *H01L 21/31* | (2006.01) | |
| *H01L 21/336* | (2006.01) | |

(52) U.S. Cl.
CPC ........ *H01L 21/845* (2013.01); *H01L 27/0886* (2013.01); *H01L 29/107* (2013.01); *H01L 29/20* (2013.01); *H01L 29/41791* (2013.01); *H01L 29/66462* (2013.01); *H01L 29/66522* (2013.01); *H01L 29/66795* (2013.01); *H01L 29/785* (2013.01); *H01L 29/7831* (2013.01); *H01L 29/78642* (2013.01); *H01L 21/02455* (2013.01); *H01L 21/02538* (2013.01); *H01L 21/02639* (2013.01); *H01L 21/02664* (2013.01); *H01L 29/2003* (2013.01)

(58) Field of Classification Search
CPC . H01L 29/785; H01L 21/845; H01L 29/7831; H01L 21/02455; H01L 21/02538; H01L 29/66522; H01L 29/20
See application file for complete search history.

(56) References Cited

U.S. PATENT DOCUMENTS

| | | | |
|---|---|---|---|
| 9,178,068 B1 | 11/2015 | Cheng et al. | |
| 9,406,566 B1 * | 8/2016 | Cheng | ............... H01L 21/02436 |
| 9,466,690 B1 | 10/2016 | Balakrishnan et al. | |
| 9,484,439 B1 | 11/2016 | Cheng et al. | |
| 9,496,401 B1 | 11/2016 | Cheng et al. | |
| 9,627,271 B1 * | 4/2017 | Leobandung | ..... H01L 29/66795 |
| 9,735,273 B1 | 8/2017 | Leobandung | |
| 9,761,694 B2 | 9/2017 | Cheng et al. | |
| 9,773,891 B1 | 9/2017 | Xiao | |
| 10,367,060 B2 * | 7/2019 | Cheng | ............... H01L 29/66742 |
| 2013/0234147 A1 | 9/2013 | Wu et al. | |
| 2015/0325436 A1 * | 11/2015 | Bentley | ............. H01L 21/02538 257/401 |
| 2016/0268122 A1 * | 9/2016 | Oniki | ................ H01L 29/66795 |
| 2016/0293760 A1 * | 10/2016 | Glass | ................ H01L 29/66818 |
| 2016/0343585 A1 | 11/2016 | Basker et al. | |
| 2016/0343705 A1 | 11/2016 | Basker et al. | |
| 2016/0380049 A1 * | 12/2016 | Cheng | ................... H01L 29/785 257/401 |
| 2016/0380053 A1 * | 12/2016 | Cohen | ................ H01L 29/78681 257/401 |
| 2017/0062215 A1 | 3/2017 | Basker et al. | |
| 2017/0186871 A1 | 6/2017 | Wu et al. | |
| 2017/0194479 A1 | 7/2017 | Lee et al. | |
| 2017/0207115 A1 | 7/2017 | Cheng et al. | |
| 2017/0229579 A1 | 8/2017 | Cheng et al. | |
| 2017/0309647 A1 * | 10/2017 | Basker | ................ H01L 29/517 |
| 2018/0033873 A1 | 2/2018 | Van et al. | |
| 2018/0061968 A1 | 3/2018 | Basker et al. | |
| 2018/0158841 A1 * | 6/2018 | Glass | ................. H01L 27/1211 |
| 2018/0166561 A1 | 6/2018 | Basker et al. | |
| 2019/0109191 A1 * | 4/2019 | Miao | ................... H01L 29/0673 |
| 2019/0181220 A1 | 6/2019 | Cheng et al. | |
| 2020/0161448 A1 * | 5/2020 | Brueck | ............. H01L 21/02639 |
| 2020/0161449 A1 * | 5/2020 | Brueck | ................... B82Y 40/00 |
| 2020/0176558 A1 * | 6/2020 | Cheng | ............. H01L 21/823431 |
| 2020/0279916 A1 * | 9/2020 | Rachmady | ........ H01L 29/66439 |

OTHER PUBLICATIONS

K. D. Choquette et al.., "Advances in Selective Wet Oxidation of AlGaAs Alloys," IEEE J. Sei. Top. Quantum Electron., vol. 3, No. 3, pp. 916-926, 1997.

* cited by examiner

METHOD OF FORMING III-V ON INSULATOR STRUCTURE ON SEMICONDUCTOR SUBSTRATE

RELATED APPLICATION

This application is a divisional application of U.S. patent application Ser. No. 15/836,206, filed on Dec. 8, 2017.

FIELD OF THE INVENTION

The present invention relates generally to a method of forming a semiconductor structure and the semiconductor structure formed, and more particularly to a method of forming a III-V semiconductor on insulator structure on semiconductor substrate, and the III-V semiconductor on insulator structure on semiconductor substrate formed.

BACKGROUND OF THE INVENTION

The mobilities of charge carriers (especially electrons) for group III-V semiconductors, particularly binary, ternary, and quaternary alloys of group III elements such as gallium, aluminum, and indium, and group V elements such as nitrogen, phosphorus, arsenic, and antimony, are generally higher than those of the group IV semiconductors such as silicon and germanium. It has also been shown that the III-V group metal-oxide-semiconductor field-effect transistor (MOSFET) has low gate leakage current, high channel mobility and high drive current. However, since silicon is the most used semiconductor for discrete devices and integrated circuits, the integration of III-V semiconductors on silicon substrate provides a unique opportunity to combine the superior characteristics of the advanced III-V semiconductor materials with the capabilities of the established silicon technologies.

For the integration of III-V semiconductors on silicon substrate, various approaches have been investigated, including: growth of buffer layers to alleviate the lattice mismatch between the III-V semiconductor structure and the Si substrate, wafer bonding, epitaxial layer transfer process, epitaxial lateral overgrowth, interfacial misfit array formation, and aspect ratio trapping (ART) techniques. ART is a promising method for forming high crystal-quality semiconductor materials on a highly lattice-mismatched substrate. ART uses high aspect ratio sub-micron trenches to trap threading dislocations, greatly reducing the dislocation density of lattice mismatched materials grown on silicon, and is shown to be very effective for a wide variety of materials including III-V semiconductors.

In view of utilizing III-V semiconductors on Si platform, III-V-on-insulator (III-V-O-I) structures are favorable because of the capability of alleviating the short-channel effects in metal-insulator-semiconductor field-effect transistor (MISFET) and the applicability to multi-gate structures. Thus, it is necessary to fabricate high quality III-V-O-I structures having high electron mobility. Since ART is capable of growing high crystal-quality III-V semiconductor materials on a highly lattice-mismatched substrate, it may be used in a method of forming the III-V-O-I structures on Si substrate with low sub-channel leakage current. However, such a method for forming a satisfactory III-V-O-I structures on Si substrate still needs to be established.

SUMMARY OF THE INVENTION

According to an aspect of the present invention, there is provided a method of forming a semiconductor structure including: providing a substrate having a first dielectric layer on the substrate, with a plurality of trenches spaced apart in a first direction and extending in a second direction crossing the first direction in the first dielectric layer, the first dielectric layer having a first height from the substrate in a third direction perpendicular to the first and second directions; forming a plurality of first III-V semiconductor patterns in the plurality of trenches to a second height lower than the first height; forming a plurality of second III-V semiconductor patterns in the plurality of trenches on the plurality of first III-V semiconductor patterns to a third height not higher than the first height to form a plurality of fins including the plurality of first and second III-V semiconductor patterns; completely removing the first dielectric layer to expose the plurality of fins; performing selective oxidation to oxidize the plurality of first III-V semiconductor patterns to form a plurality of oxidized first III-V semiconductor patterns; performing fin patterning; forming a second dielectric layer to cover the plurality of fins; and recessing the second dielectric layer to a level not higher than top surfaces of the plurality of oxidized first III-V semiconductor patterns.

In the method of manufacturing the semiconductor structure, the plurality of first III-V semiconductor patterns may include a first III-V semiconductor including aluminum (Al). Aluminum mole fraction may be in a range from about 50% to about 100% of group III component in the first III-V semiconductor. The first III-V semiconductor may include one of aluminum antimonide (AlSb), aluminum arsenide (AlAs), aluminum phosphide (AlP), aluminum gallium arsenide (AlGaAs), aluminum indium arsenide (AlInAs), aluminum indium antimonide (AlInSb), aluminum gallium antimonide (AlGaSb), aluminum gallium phosphide (AlGaP), aluminum indium phosphide (AlInP), aluminum gallium nitride (AlGaN), aluminum indium nitride (AlInN), aluminum arsenide antimonide (AlAsSb), aluminum arsenide phosphide (AlAsP), aluminum phosphide antimonide (AlPSb), aluminum gallium indium phosphide (AlGaInP), aluminum gallium arsenide phosphide (AlGaAsP), aluminum indium arsenide phosphide (AlInAsP), aluminum gallium arsenide antimonide (AlGaAsSb), aluminum gallium phosphide antimonide (AlGaPSb), aluminum indium gallium antimonide (AlInGaSb) and combinations thereof. The forming of the plurality of first III-V semiconductor patterns and the forming of the plurality of second III-V semiconductor patterns may be carried out with an epitaxial growth process. The plurality of first III-V semiconductor patterns may include a first lattice, the plurality of second III-V semiconductor patterns may include a second lattice, and the first lattice may match the second lattice. The plurality of first III-V semiconductor patterns may include aluminum gallium arsenide (AlGaAs) and the plurality of second III-V semiconductor patterns may include gallium arsenide (GaAs), or the plurality of first III-V semiconductor patterns may include aluminum indium arsenide (AlInAs) and the plurality of second III-V semiconductor patterns may include indium gallium arsenide (InGaAs). The performing of the selective oxidation to oxidize the plurality of first III-V semiconductor patterns may be carried out in an environment with water vapor at a temperature in a range from about 200° C. to about 600° C. The substrate may be a silicon substrate. The plurality of second III-V semiconductor patterns may include a second III-V semiconductor not including aluminum (Al). The second height may be about 10 nm or higher. The method of manufacturing the semiconductor structure may further include forming source/drain structures and gate structures, which surround the plurality of fins and are arranged on the second dielectric layer in the second direction to form lateral transport FinFETs, or surround the plurality of fins and are stacked on the second dielectric layer in the third direction to form vertical transport FinFETs.

According to another aspect of the present invention, there is provided a method of forming a semiconductor structure including: providing a silicon substrate or a silicon on insulator substrate having a first dielectric layer on the silicon substrate or the silicon on insulator substrate, with a plurality of trenches spaced apart in a first direction and extending in a second direction crossing the first direction in the first dielectric layer, the first dielectric layer having a first height from the silicon substrate or the silicon on insulator substrate in a third direction perpendicular to the first and second directions; forming a plurality of first III-V semiconductor patterns in the plurality of trenches to a second height lower than the first height; forming a plurality of second III-V semiconductor patterns in the plurality of trenches on the plurality of first III-V semiconductor patterns to a third height not higher than the first height to form a plurality of fins including the plurality of first and second III-V semiconductor patterns; completely removing the first dielectric layer to expose the plurality of fins; performing selective oxidation to oxidize the plurality of first III-V semiconductor patterns to form a plurality of oxidized first III-V semiconductor patterns; performing fin patterning; forming a second dielectric layer to cover the plurality of fins; and recessing the second dielectric layer to a level not higher than top surfaces of the plurality of oxidized first III-V semiconductor patterns, in which the plurality of first III-V semiconductor patterns may include at least aluminum (Al), at least one of group V elements of nitrogen (N), phosphorus (P), arsenic (As), antimony (Sb) and bismuth (Bi), and optionally one or more other group III elements of boron (B), gallium (Ga), and indium (In), the plurality of second III-V semiconductor patterns may include at least one of group III elements of boron (B), gallium (Ga) and indium (In), and at least one of group V elements of nitrogen (N), phosphorus (P), arsenic (As), antimony (Sb) and bismuth (Bi), and the plurality of first III-V semiconductor patterns may include a first lattice, the plurality of second III-V semiconductor patterns may include a second lattice, and the first lattice may match the second lattice.

According to another aspect of the present invention, there is provided a semiconductor structure including: a semiconductor substrate; a plurality of fins disposed on the semiconductor substrate, spaced apart in a first direction and extending in a second direction crossing the first direction, each of the plurality of fins vertically protruding in a third direction perpendicular to the first and second directions, and including an oxidized first III-V semiconductor pattern and a second III-V semiconductor pattern sequentially stacked on the semiconductor substrate; and a dielectric layer formed over the semiconductor substrate and surrounding the plurality of fins, in which top surface of the oxidized first III-V semiconductor pattern is not lower than top surface of the dielectric layer, and the oxidized first III-V semiconductor pattern includes aluminum oxide.

In the semiconductor structure, the oxidized first III-V semiconductor pattern before oxidation may include a first III-V semiconductor having a first lattice, the second III-V semiconductor pattern may include a second III-V semiconductor having a second lattice, and the first lattice may match the second lattice. The first III-V semiconductor may be aluminum gallium arsenide (AlGaAs) and the second III-V semiconductor may be gallium arsenide (GaAs), or the first III-V semiconductor may be aluminum indium arsenide (AlInAs) and the second III-V semiconductor may be indium gallium arsenide (InGaAs). The first III-V semiconductor may include one of aluminum antimonide (AlSb), aluminum arsenide (AlAs), aluminum phosphide (AlP), aluminum gallium arsenide (AlGaAs), aluminum indium arsenide (AlInAs), aluminum indium antimonide (AlInSb), aluminum gallium antimonide (AlGaSb), aluminum gallium phosphide (AlGaP), aluminum indium phosphide (AlInP), aluminum gallium nitride (AlGaN), aluminum indium nitride (AlInN), aluminum arsenide antimonide (AlAsSb), aluminum arsenide phosphide (AlAsP), aluminum phosphide antimonide (AlPSb), aluminum gallium indium phosphide (AlGaInP), aluminum gallium arsenide phosphide (AlGaAsP), aluminum indium arsenide phosphide (AlInAsP), aluminum gallium arsenide antimonide (AlGaAsSb), aluminum gallium phosphide antimonide (AlGaPSb), aluminum indium gallium antimonide (AlInGaSb) and combinations thereof. The oxidized first III-V semiconductor pattern may include an oxidized first III-V semiconductor having aluminum mole fraction in a range from about 50% to about 100% of group III component of the oxidized first III-V semiconductor. The semiconductor substrate may be a silicon substrate or a silicon on insulator substrate. A height in the third direction of the oxidized first III-V semiconductor may be about 10 nm or higher. The semiconductor structure may further include source/drain structures and gate structures, which are disposed on the dielectric layer, surrounding the plurality of fins, and arranged in the second direction to form lateral transport FinFETs, or are disposed on the dielectric layer, surrounding the plurality of fins, and stacked in the third direction to form vertical transport FinFETs.

BRIEF DESCRIPTION OF THE DRAWINGS

The present invention may best be understood from the following detailed description of preferred embodiments, taken in conjunction with the accompanying drawings, and in which.

Since the drawings in FIGS. 2-10 are intended for illustrative purpose, the elements in the drawings are not necessarily drawn to scale. For example, some of the elements may be enlarged or exaggerated for clarity purpose.

DETAILED DESCRIPTION OF PREFERRED EMBODIMENTS

The present invention relates generally to a method of manufacturing a semiconductor structure, and the semiconductor structure manufactured. Specifically, the present invention relates to a method of forming a III-V semiconductor on insulator structure on semiconductor substrate, and the III-V semiconductor on insulator structure on semiconductor substrate formed. More specifically, a method of forming a III-V semiconductor on insulator structure on silicon substrate may be provided by making use of the aspect ratio trapping (ART) technique to grow a vertical fin structure including a first and second III-V semiconductor patterns on the silicon substrate, in which the first III-V semiconductor pattern includes aluminum, and then also making use of the selective lateral wet oxidation of the aluminum containing first III-V semiconductor pattern to form an insulator structure with the second III-V semiconductor pattern remaining as an active III-V fin. A dielectric layer may be formed to surround the oxidized aluminum containing first III-V semiconductor pattern. The vertical fin structure formed above provides high crystal-quality III-V semiconductor material in the second III-V semiconductor pattern for high electron mobility, and current leakage free insulator material in the oxidized aluminum containing first III-V semiconductor pattern to block leakage path. Thus, a semiconductor device manufactured using the above described III-V semiconductor on insulator structure on silicon substrate may have low gate leakage current, high channel mobility and high drive current. Exemplary embodiments of the present invention provide a method of forming a III-V semiconductor on insulator structure on semiconductor substrate, so that the active fins would have high crystal-quality III-V semiconductor material for high electron mobility and the insulator structure would reduce current leakage, and also provide the III-V semiconductor on insulator structure on semiconductor substrate.

It will be understood that when an element such as a layer, region or substrate is referred to as being "on" or "over" another element, it can be directly on or over the other element or intervening elements may also be present. In contrast, when an element is referred to as being "directly on" or "directly over" another element, there are no intervening elements present. As used herein, the singular forms "a", "an" and "the" are intended to include the plural forms as well, unless the context clearly indicates otherwise.

Figure 1:
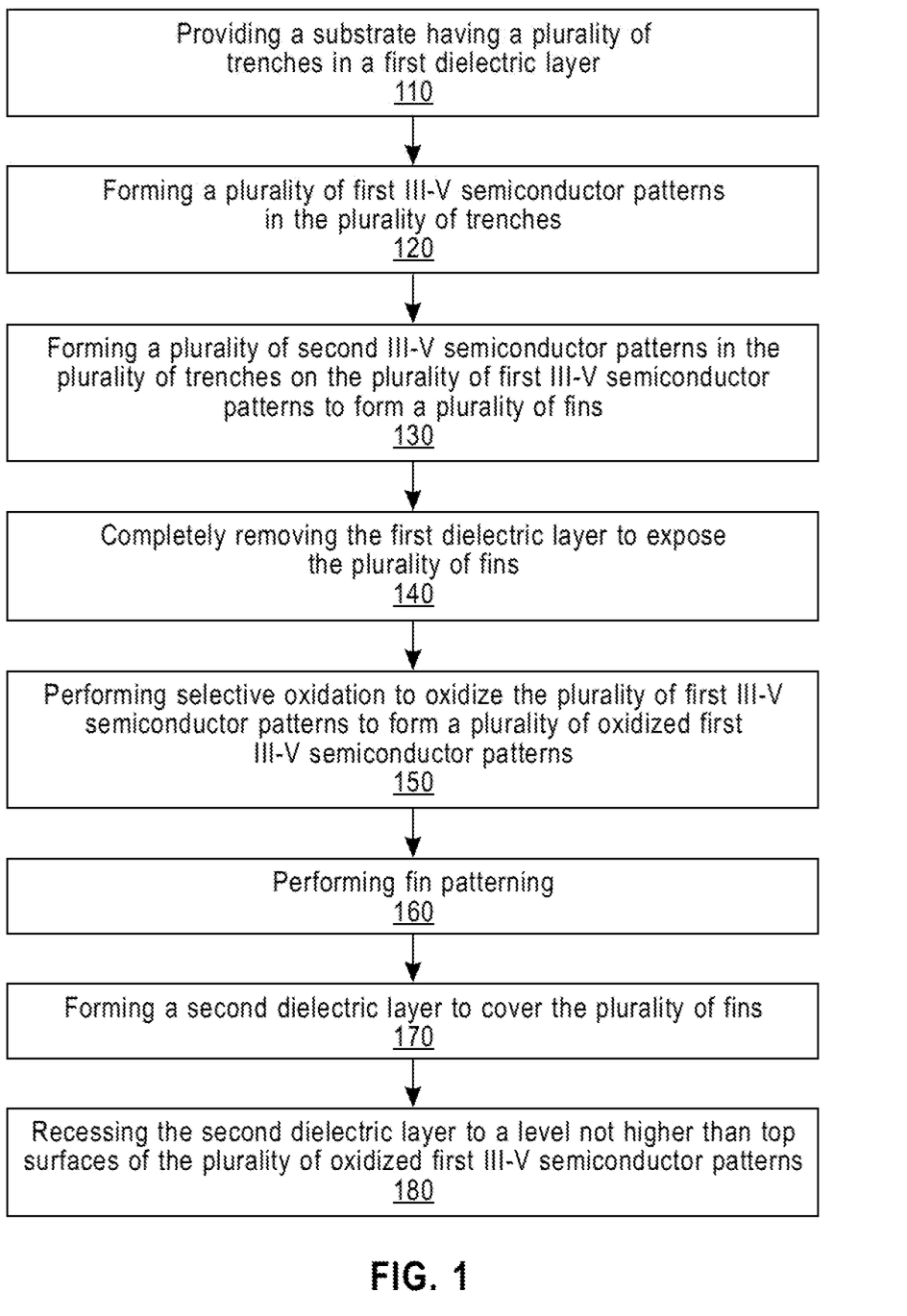
FIG. 1 is a flow chart of a method of forming a semiconductor structure according to an exemplary embodiment of the present invention.

According to an exemplary embodiment of the present invention, a method of manufacturing a semiconductor structure may include the following steps: providing a substrate having a first dielectric layer on the substrate, with a plurality of trenches spaced apart in a first direction and extending in a second direction crossing the first direction in the first dielectric layer, the first dielectric layer having a first height from the substrate in a third direction perpendicular to the first and second directions; forming a plurality of first III-V semiconductor patterns in the plurality of trenches to a second height lower than the first height; forming a plurality of second III-V semiconductor patterns in the plurality of trenches on the plurality of first III-V semiconductor patterns to a third height not higher than the first height to form a plurality of fins including the plurality of first and second III-V semiconductor patterns; completely removing the first dielectric layer to expose the plurality of fins; performing selective oxidation to oxidize the plurality of first III-V semiconductor patterns to form a plurality of oxidized first III-V semiconductor patterns; performing fin patterning; forming a second dielectric layer to cover the plurality of fins; and recessing the second dielectric layer to a level not higher than top surfaces of the plurality of oxidized first III-V semiconductor patterns. The sequence of the steps as described above is preferred. However, the present invention is not limited to the performance of these steps with the sequence or order presented above. Many steps may also be applied to the substrate before, between or after the steps shown above. FIG. 1 is a flow chart of a method of forming a semiconductor structure according to an exemplary embodiment of the present invention. FIGS. 2-8 are demonstrative illustrations of perspective and cross-sectional views of structures in the method of forming the semiconductor structure according to an exemplary embodiment of the present invention.

Figure 2:
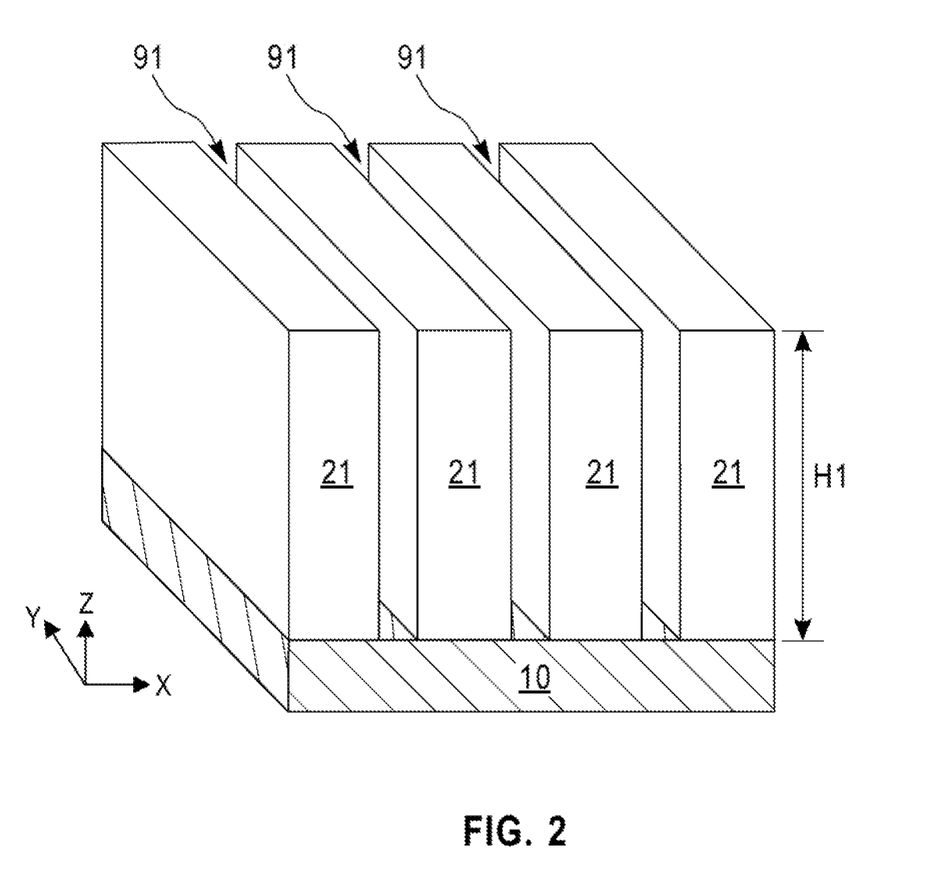
FIG. 2 is a schematic perspective-view diagram representing a plurality of trenches formed in a first dielectric layer on a substrate according to an exemplary embodiment of the present invention.

At block 110 of FIG. 1, a substrate having a plurality of trenches in a first dielectric layer may be provided. Referring to FIG. 2, FIG. 2 is a schematic perspective-view diagram representing a plurality of trenches 91 formed in a first dielectric layer 21 on a substrate 10 according to an exemplary embodiment of the present invention. The substrate 10 may be any suitable substrate, and may include a semiconducting material such as, for example, silicon (Si), germanium (Ge), silicon germanium (SiGe), silicon carbide (SiC), gallium nitride (GaN) or gallium arsenide (GaAs), a non-semiconducting material such as, for example, silicon oxide ($SiO_2$), aluminum (Al), aluminum oxide ($Al_2O_3$), ceramic, quartz, or copper (Cu), or any combination thereof, including multilayers, for example, germanium on insulator (GeOI), germanium on silicon, or silicon on insulator (SOI). The substrate 10 can include one or more semiconductor layers or structures and can include active or operable portions of semiconductor devices. For some applications, the substrate 10 may be a semiconductor substrate doped with impurities to render them p-type or n-type. In a p-doped silicon substrate, the Si substrate may be doped with p-type dopants such as, for example, boron (B), aluminum (Al), gallium (Ga) and indium (In). In an n-doped silicon substrate, the Si substrate may be doped with n-type dopants such as, for example, antimony (Sb), arsenic (As) and phosphorous (P). The preferable substrate material for the substrate 10 is Si.

The first dielectric layer 21 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluorethylene or PTFE), silicon oxyfluoride (FSG), carbon doped $SiO_2$ (SiCO), hydrogenated silicon oxycarbide (SiCOH), or other low k dielectric materials. In some instances, high k dielectric materials may also be used for the first dielectric layer 21. The first dielectric layer 21 may be formed by a deposition process including, for example, chemical vapor deposition (CVD), plasma enhanced CVD (PECVD), evaporation or spin coating. The first dielectric layer 21 may be deposited on the entire surface of the substrate 10, then patterned to form a plurality of trenches 91 spaced apart in a first direction (X direction) and extending in a second direction (Y direction) crossing the first direction (X direction) in the first dielectric layer 21. The first dielectric layer 21 may have a first height H1 from the substrate 10 in a third direction (Z direction) perpendicular to the first and second directions (X and Y directions). The plurality of trenches 91 may also have the first height H1. The first height H1 may be in a range from about 20 nm to about 510 nm. The plurality of trenches 91 may be formed through a photolithographic process and an etching process. A typical photolithographic process may include the following steps: preparing substrate, coating photoresist, baking, exposing and developing. The patterning process may use a positive tone resist with a positive tone development process or may use negative tone development (NTD) process with solvent-based developer. The exposure of the photoresist layer may be carried out with a conventional lithography such as, a KrF (248 nm) or an ArF (193 nm) deep UV (DUV) lithography, or may be carried out with an EUV lithography. The etching process may be an anisotropic dry etch process such as reactive ion etch (ME) process, and may use the patterned photoresist as an etch mask. The etching process may be carried out until the substrate 10 is exposed in the plurality of trenches 91. When the first dielectric layer 21 is formed of $SiO_2$, to pattern etch the first dielectric layer 21 may use etchants containing fluorine, such as: $CF_4$, and/or $CF_2$/$CH_2F_2$.

The plurality of trenches 91 are formed for the ART technique. ART uses high aspect ratio sub-micron trenches to trap threading dislocations, greatly reducing the dislocation density of lattice mismatched materials grown on silicon, and is shown to be very effective for a wide variety of materials including III-V semiconductors. The trench width may be less than 120 nm. For example, the trench width may be in a range from about 5 nm to about 100 nm, and the trench pitch may be in a range from about 10 nm to about 200 nm.

Figure 3:
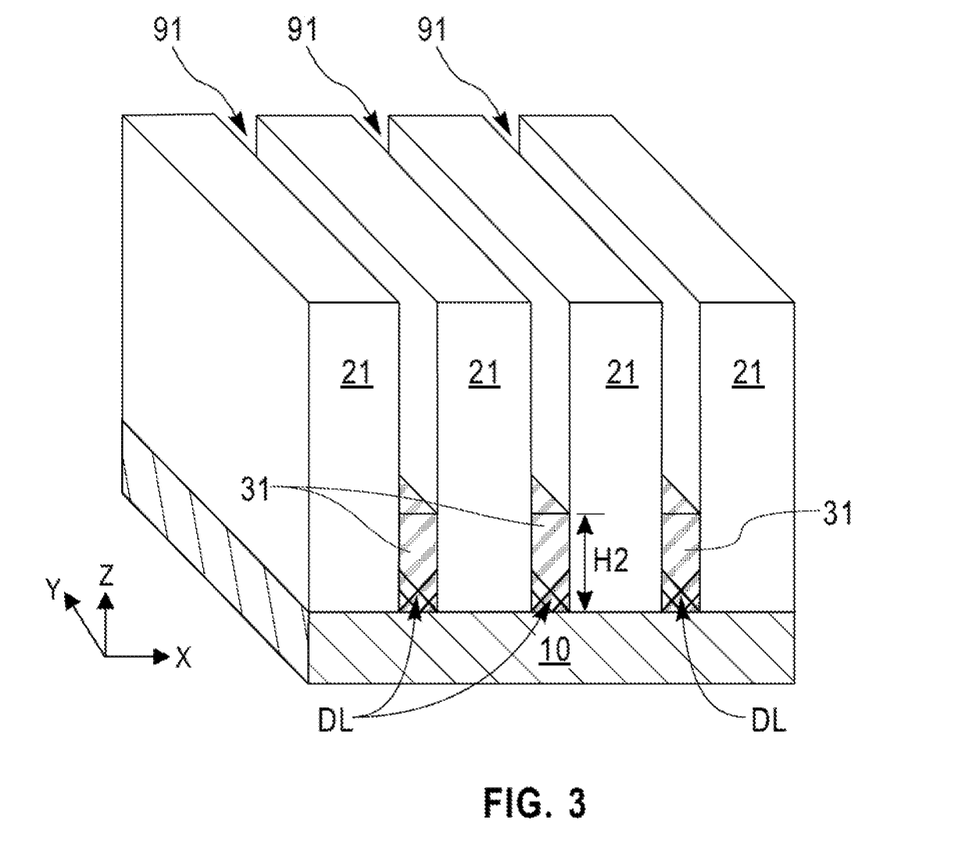
FIG. 3 is a schematic perspective-view diagram representing a plurality of first III-V semiconductor patterns formed in the plurality of trenches on the substrate according to an exemplary embodiment of the present invention.

At block 120 of FIG. 1, a plurality of first III-V semiconductor patterns may be formed in the plurality of trenches 91. Referring to FIG. 3, FIG. 3 is a schematic perspective-view diagram representing a plurality of first III-V semiconductor patterns 31 formed in the plurality of trenches 91 on the substrate 10 according to an exemplary embodiment of the present invention. The plurality of first III-V semiconductor patterns 31 may include a first III-V semiconductor which includes at least aluminum (Al), at least one of group V elements of nitrogen (N), phosphorus (P), arsenic (As), antimony (Sb) and bismuth (Bi), and optionally one or more other group III elements of boron (B), gallium (Ga) and indium (In). For example, the first III-V semiconductor may be a binary, ternary, or quaternary alloy including at least aluminium (Al), at least one of group V elements, and optionally one or more other group III elements. The binary alloy may be, for example, one of aluminum antimonide (AlSb), aluminum arsenide (AlAs), and aluminum phosphide (AlP). The ternary alloy may be, for example, one of aluminum gallium arsenide (AlGaAs), aluminum indium arsenide (AlInAs), aluminum indium antimonide (AlInSb), aluminum gallium antimonide (AlGaSb), aluminum gallium phosphide (AlGaP), aluminum indium phosphide (AlInP), aluminum gallium nitride (AlGaN), aluminum indium nitride (AlInN), aluminum arsenide antimonide (AlAsSb), aluminum arsenide phosphide (AlAsP), and aluminum phosphide antimonide (AlPSb). The quaternary alloy may be, for example one of aluminum gallium indium phosphide (AlGaInP), aluminum gallium arsenide phosphide (AlGaAsP), aluminum indium arsenide phosphide (AlInAsP), aluminum gallium arsenide antimonide (AlGaAsSb), aluminum gallium phosphide antimonide (AlGaPSb), aluminum indium gallium antimonide (AlInGaSb). Aluminum (Al) mole fraction may be in a range from about 50% to about 100% of group III component in the first III-V semiconductor. For example, for the aluminum arsenide (AlAs) or aluminum arsenide antimonide (AlAsSb), the Al mole fraction is 100% of the group III element. In aluminum gallium arsenide with formula $Al_xGa_{1-x}As$, the mole fraction x for Al may be about 0.5 (50%) or higher, but not 1 (100%). Due to variation in forming the ternary or quaternary alloy, here, about 0.5 may indicate from 0.47 to 0.53. Also, the mole fraction x for Al in $Al_xGa_{1-x}As$, may be very close to 1 (100%), such as $Al_{0.98}Ga_{0.02}As$ or $Al_{0.99}Ga_{0.01}As$. Similarly, in aluminum gallium arsenide phosphide with formula $Al_xGa_{1-x}AsP$, the mole fraction x for Al may be about 0.5 (50%) or higher, but not 1 (100%). Also, in aluminum gallium indium phosphide with formula $Al_xGa_yIn_{1-x-y}P$, the mole fraction x for Al may be about 0.5 (50%) or higher, but not 1 (100%). Aluminum (Al) mole fraction in a range from about 50% to about 100% of group III component in the first III-V semiconductor may allow easy oxidation and may render the oxidized first III-V semiconductor sufficiently insulating to alleviate current leakage. The oxidation of the first III-V semiconductor will be described in a subsequent process step. However, the present invention is not limited thereto. The Al mole fraction may be less than 50% as long as the oxidized III-V semiconductor is sufficiently insulating. For example, Al mole fraction may be in a range from about 35% to about 100% of group III component in the first III-V semiconductor. The plurality of first III-V semiconductor patterns 31 may be formed on the substrate 10 in the plurality of trenches 91 with various deposition processes, and may include, physical vapor deposition (PVD), atomic layer deposition (ALD), spin coating, and an epitaxial growth process. Various epitaxial growth processes may be used to form the plurality of first III-V semiconductor patterns 31, and may include, for example, rapid thermal chemical vapor deposition (RTCVD), low energy plasma deposition (LEPD), metal organic chemical vapor deposition (MOCVD), ultra-high vacuum chemical vapor deposition (UF1VCVD), atmospheric pressure chemical vapor deposition (APCVD) and molecular beam epitaxy (MBE).

As shown in FIG. 3, the plurality of first III-V semiconductor patterns 31 are formed in the plurality of trenches 91 to a second height H2 lower than the first height H1. The first height H1 is the height from the top surface of the substrate 10 to the top surface of the first dielectric layer 21. The second height H2 is the height from the top surface of the substrate 10 to the top surface of each of the plurality of first III-V semiconductor patterns 31. The second height H2 may vary based on the need of the semiconductor device to be built. However, the second height H2 requires a height high enough to have defect free top surface. As shown in FIG. 3, dislocations DL are formed at the lower portion of the plurality of first III-V semiconductor patterns 31 near the top surface of the substrate 10 in the plurality of trenches 91. Dislocation defects may arise in an effort to epitaxially grow one kind of crystalline material on the substrate 10 of a different kind of material, due to different crystalline lattice sizes of the two materials, for example, here, the material of the substrate 10 and the material of the plurality of the first III-V semiconductor patterns 31. This lattice mismatch between the substrate 10 and the subsequently deposited layer(s) such as the plurality of first III-V semiconductor patterns 31 creates stress during material deposition that generates dislocation defects in the plurality of first III-V semiconductor patterns 31. Depending on how much mismatch between the lattice of the material of the substrate 10 and the lattice of the material of the plurality of first III-V semiconductor patterns 31, the dislocations DL may spread to a different height accordingly. The larger the mismatch, the higher the dislocations DL spread. In other words, for larger lattice mismatch between the lattice of the material of the substrate 10 and the lattice of the material of the plurality of first III-V semiconductor patterns 31, it requires the second high higher to obtain defect free top surface for the plurality of first III-V semiconductor patterns 31. The second height H2 may be about 10 nm or higher. For example, the second height H2 may be in a range from about 10 nm to about 500 nm. The second height H2 may be about 15 to 50% of the first height H1, although lesser and greater percentage may also be employed.

Figure 4:
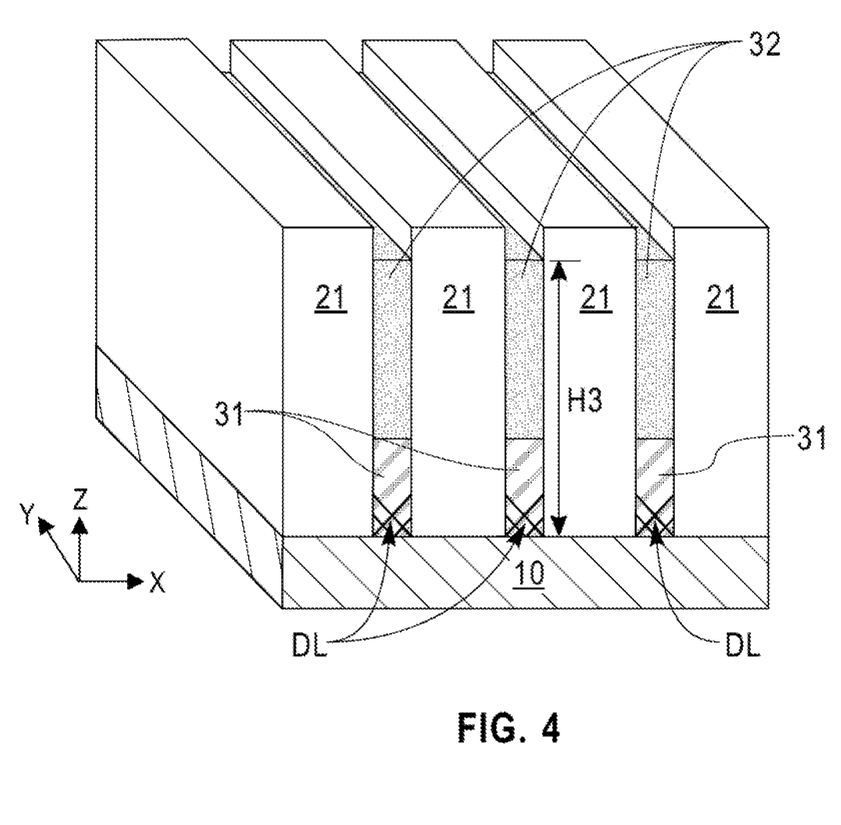
FIG. 4 is a schematic perspective-view diagram representing a plurality of second III-V semiconductor patterns formed in the plurality of trenches on the plurality of first III-V semiconductor patterns to form a plurality of fins according to an exemplary embodiment of the present invention.

At block 130 of FIG. 1, a plurality of second III-V semiconductor patterns may be formed in the plurality of trenches 91 on the plurality of first III-V semiconductor patterns 31 to form a plurality of fins. Referring to FIG. 4, FIG. 4 is a schematic perspective-view diagram representing a plurality of second III-V semiconductor patterns 32 formed in the plurality of trenches 91 on the plurality of first III-V semiconductor patterns 31 to form a plurality of fins according to an exemplary embodiment of the present invention. The plurality of fins may include the plurality of first III-V semiconductor patterns 31 and the plurality of second III-V semiconductor patterns 32 sequentially stacked on the substrate 10. The plurality of second III-V semiconductor patterns 32 may include a second III-V semiconductor which includes at least one of group III elements of boron (B), gallium (Ga), and indium (In), and at least one of group V elements of nitrogen (N), phosphorus (P), arsenic (As), antimony (Sb) and bismuth (Bi). For example, the second III-V semiconductor may be a binary, ternary, or quaternary alloy including at least one of group III elements and at least one of group V elements. The binary alloy may be, for example, one of GaAs, GaN, GaP, InP, InAs, InSb, and GaSb. The ternary alloy may be, for example, one of InGaAs, InGaP, InGaSb, GaAsSb, InAsSb, GaAsP, and InGaN. The quaternary alloy may be, for example one of InAsSbP, GaInAsSb, and GaInPAs. The second III-V semiconductor may not include Al, or may include small amount of Al. If the Al is included in the second III-V semiconductor, the amount should be small enough that no significant oxidation would occur to the second III-V semiconductor during the wet oxidation of the first III-V semiconductor. The plurality of second III-V semiconductor patterns 32 may be formed on the plurality of first III-V semiconductor patterns 31 in the plurality of trenches 91 with various deposition processes, and may include, physical vapor deposition (PVD), atomic layer deposition (ALD), spin coating, and an epitaxial growth process. Various epitaxial growth processes may be used to form the plurality of second III-V semiconductor patterns 32, and may include, for example, rapid thermal chemical vapor deposition (RTCVD), low energy plasma deposition (LEPD), metal organic chemical vapor deposition (MOCVD), ultra-high vacuum chemical vapor deposition (UF1VCVD), atmospheric pressure chemical vapor deposition (APCVD) and molecular beam epitaxy (MBE).

The plurality of second III-V semiconductor patterns 32 may be formed to a third height H3 not higher than the first height H1 to form a plurality of fins which include the plurality of first III-V semiconductor patterns 31 and the plurality of second III-V semiconductor patterns 32 sequentially stacked on the substrate 10. The third height H3 is a height from the top surface of the substrate 10 to the top surface of each of the plurality of second III-V semiconductor patterns 32. In the forming of the plurality of second III-V semiconductors 32, the second III-V semiconductor may not completely fill the plurality of trenches 91 to the top surface of the first dielectric layer 21. However, the second III-V semiconductor may overfill the plurality of trenches 91, and then a chemical mechanical polishing (CMP) process may be used to planarize the top surface of the plurality of second III-V semiconductor patterns 32 until the top surface of the first dielectric layer 21 is exposed.

The plurality of first III-V semiconductor patterns 31 may include a first lattice, the plurality of second III-V semiconductor patterns may include a second lattice, and the first lattice matches the second lattice. As described above, the top surfaces of the plurality of first III-V semiconductor patterns 31 may include defect free, for example, free of dislocations DL, and high crystal-quality first III-V semiconductor material, and when the plurality of second III-V semiconductor patterns 32 are formed on the plurality of first III-V semiconductor patterns 31 with the lattice of the second III-V semiconductor material matched to the lattice of the first III-V semiconductor material, the plurality of second III-V semiconductor patterns 32 formed will include high crystal-quality second III-V semiconductor material. For the lattice to match, both materials may have the same lattice constant or their lattice constants very close to each other. For example, AlAs, AlP, AlGaAs, AlInAs, AlAsSb and AlInP may be lattice matched to GaAs, GaP, GaAs, InGaAs, InP and GaAs, respectively. In an exemplary embodiment of the present invention, the plurality of first III-V semiconductor patterns 31 may include AlGaAs and the plurality of second III-V semiconductor patterns 32 may include GaAs, or the plurality of first III-V semiconductor patterns 31 may include AlInAs and the plurality of second III-V semiconductor patterns 32 may include InGaAs.

At block 140 of FIG. 1, the first dielectric layer 21 may be completely removed to expose the plurality of fins. The first dielectric layer 21 may be completely removed with a wet or dry etch process. When the first dielectric layer 21 is silicon oxide, the silicon oxide may be stripped with dilute hydrofluoric acid (DHF). A dry etch process may also be used with etchants containing fluorine, such as: $CF_4$, and/or $CF_2/CH_2F_2$. Any process used to remove the first dielectric layer 21 needs to be selective to the plurality of first and second III-V semiconductor patterns 31 and 32. In other words, the etch process used will only remove the first dielectric layer 21 not the plurality of first and second III-V semiconductor patterns 31 and 32.

Figure 5:
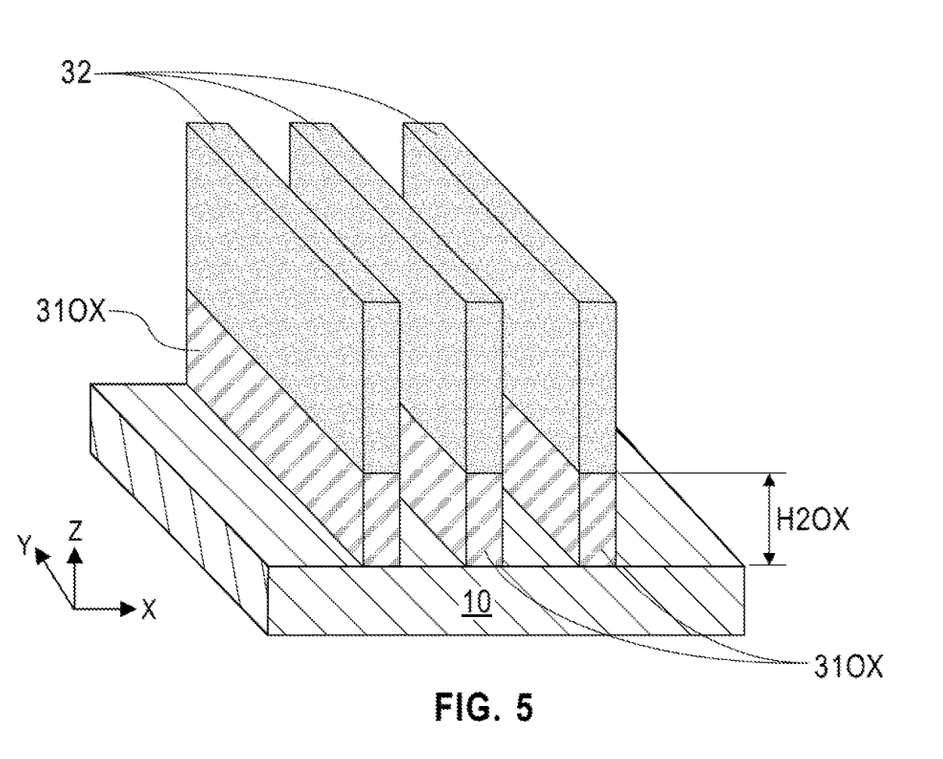
FIG. 5 is a schematic perspective-view diagram representing the plurality of fins exposed after the removal of the first dielectric layer and the oxidation of the plurality of first III-V semiconductor patterns according to an exemplary embodiment of the present invention.

At block 150 of FIG. 1, selective oxidation may be performed to oxidize the plurality of first III-V semiconductor patterns 31 to form a plurality of oxidized first III-V semiconductor patterns. Referring to FIG. 5, FIG. 5 is a schematic perspective-view diagram representing the plurality of fins exposed after the removal of the first dielectric layer 21 and the oxidation of the plurality of first III-V semiconductor patterns 31 according to an exemplary embodiment of the present invention. The selective oxidation process may be a thermal oxidation process with oxygen ($O_2$) or a selective lateral wet oxidation process with water ($H_2O$). The selective lateral wet oxidation process may include exposing the plurality of fins to water vapor transported in an inert gas within an elevated temperature in a range from about 200° C. to about 600° C. environment, to selectively laterally oxidize the aluminum containing first III-V semiconductor of the plurality of first III-V semiconductor patterns 31. A stable water vapor carried by nitrogen ($N_2$) or other inert gas from a water bath maintained at 90° C. may be steadily injected into the heated reaction chamber to enable a stable and reproducible oxidation process. Aluminum oxide ($Al_2O_3$) may be formed in the plurality of oxidized first III-V semiconductor patterns 31OX. In the selective lateral wet oxidation process, the second III-V semiconductor of the plurality of second III-V semiconductor patterns 32 may not be oxidized at all or may be minimally oxidized. Since no oxidation occurred on the plurality of second III-V semiconductor patterns 32, the second III-V semiconductor in the plurality of second III-V semiconductor patterns 32 may remain as active III-V semiconductor material. The plurality of first III-V semiconductor patterns 31 after oxidation may expand or shrink, and generally may shrink. Thus, the plurality of oxidized first III-V semiconductor patterns 31OX may have an oxidized second height H2OX smaller than the second height H2 of the plurality of first III-V semiconductor patterns 31. The plurality of oxidized first III-V semiconductor patterns 31OX including aluminum oxide ($Al_2O_3$) may become insulator to prevent current leakage from the plurality of second III-V semiconductor patterns 32 above to the substrate 10.

Figure 6:
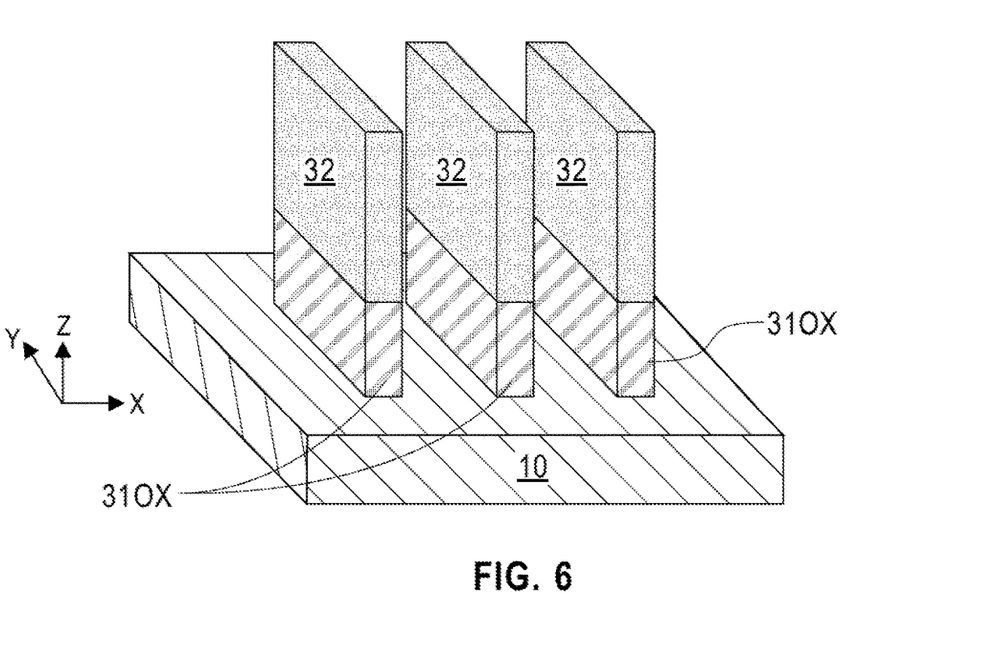
FIG. 6 is a schematic perspective-view diagram representing the plurality of fins patterned according to an exemplary embodiment of the present invention.

At block 160 of FIG. 1, fin patterning may be performed. In other words, fin cut or any other type of patterning may be performed wherever is needed. Referring to FIG. 6, FIG. 6 is a schematic perspective-view diagram representing the plurality of fins patterned according to an exemplary embodiment of the present invention. The plurality of fins may be patterned through a photolithographic process and an etching process. Due to the topographic structure of the plurality of fins, a tri-layer photolithographic process may be used to form a mask pattern for patterning the plurality of fins. The tri-layer photolithographic process may include the following steps: spin coating a spin-on hard mask layer to cover the plurality of fins; depositing a silicon containing antireflective coating interlayer on the spin-on hard mask layer; spin coating a photoresist layer on the silicon containing antireflective coating interlayer; exposing the photoresist layer with a photomask containing a pattern for cutting the plurality of fins; and baking and developing the exposed photoresist layer to form a photoresist pattern containing the pattern for cutting the plurality of fins. Various etchants may be used to etch the silicon containing antireflective coating interlayer, the spin-on hard mask layer and the plurality of fins. When the first III-V semiconductor is AlGaAs and the second III-V semiconductor is GaAs, a range of etchants may be used to etch the plurality of fins, including, for example, $SiCl_4/Ar$, $BCl_3/Cl_2$, $SiCl_4/Cl_2$, and $CH_4/H_2/Cl_2$.

Figure 7:
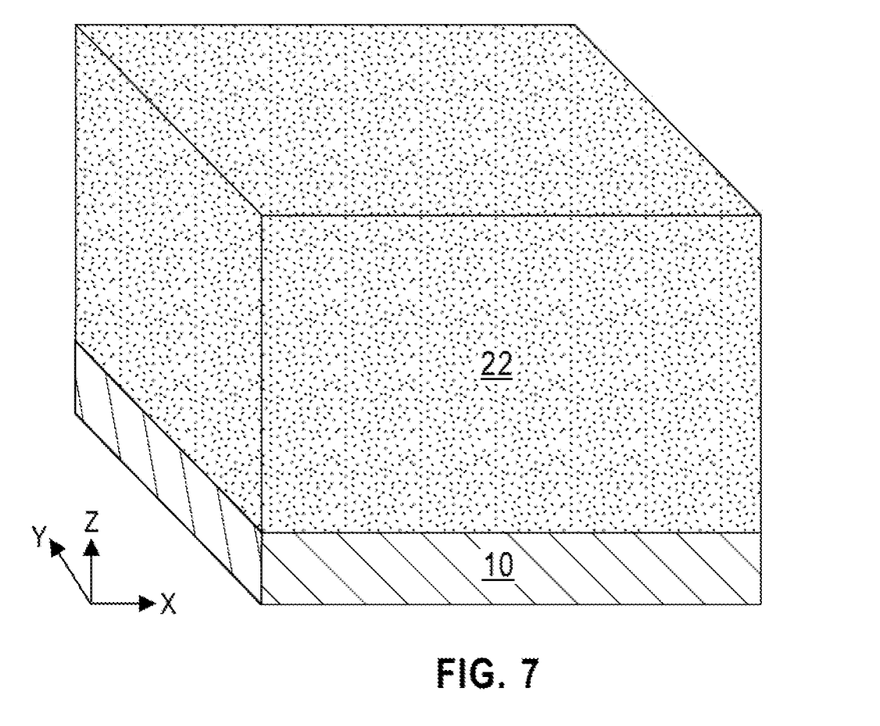
FIG. 7 is a schematic perspective-view diagram representing a second dielectric layer formed to cover the plurality of fins according to an exemplary embodiment of the present invention.

At block 170 of FIG. 1, a second dielectric layer may be formed to cover the plurality of fins. Referring to FIG. 7, FIG. 7 is a schematic perspective-view diagram representing a second dielectric layer 22 formed to cover the plurality of fins according to an exemplary embodiment of the present invention. The second dielectric layer 22 may include a material the same as that of the first dielectric layer 21, may be formed by a method the same as that of the first dielectric layer 21, and may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluoroethylene or PTFE), silicon oxyfluoride (FSG), carbon doped $SiO_2$ (SiCO), hydrogenated silicon oxycarbide (SiCOH), or other low k dielectric materials. The second dielectric layer 22 may be formed by a deposition process including, for example, CVD, PECVD, evaporation or spin coating. The preferable material for the second dielectric layer 22 is $SiO_2$. A second dielectric layer 22 may be formed to completely cover the plurality of fins, and then the top surface may be planarized by a CMP process.

Figure 8:
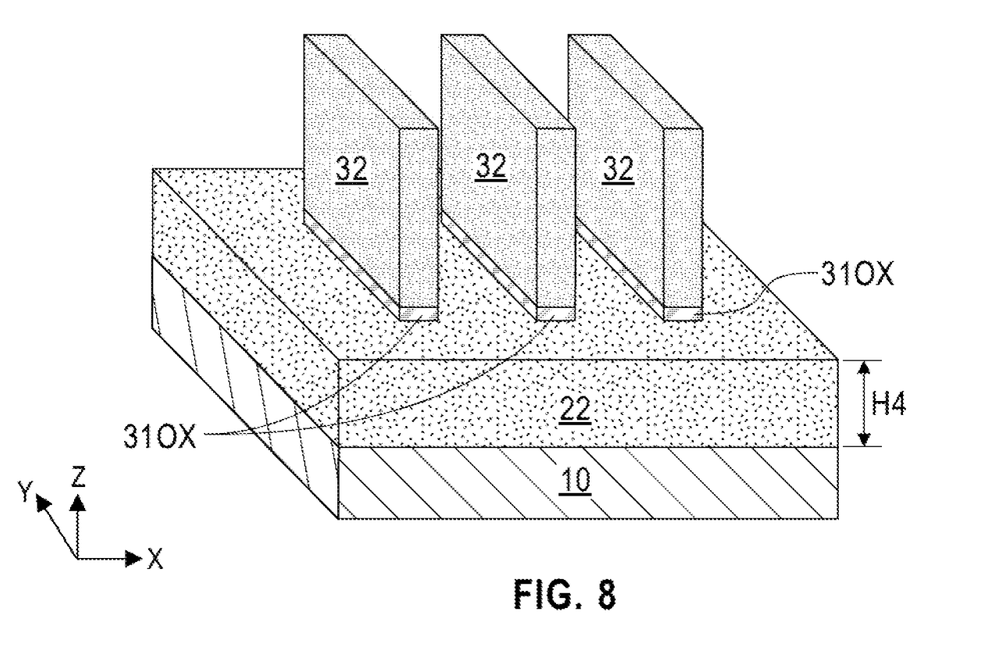
FIG. 8 is a schematic perspective-view diagram representing the second dielectric layer recessed to a level not higher than top surfaces of the plurality of oxidized first III-V semiconductor patterns according to an exemplary embodiment of the present invention.
Figure 9A:
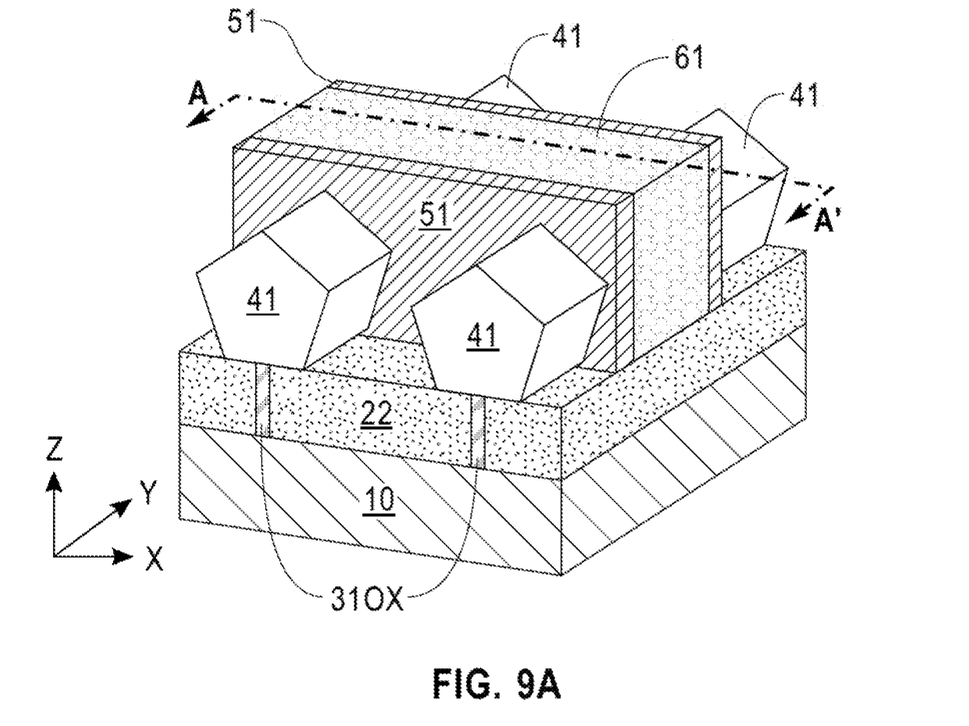
FIG. 9A is a schematic perspective-view diagram representing a lateral transport FinFET formed from the semiconductor structure shown in FIG. 8.
Figure 9B:
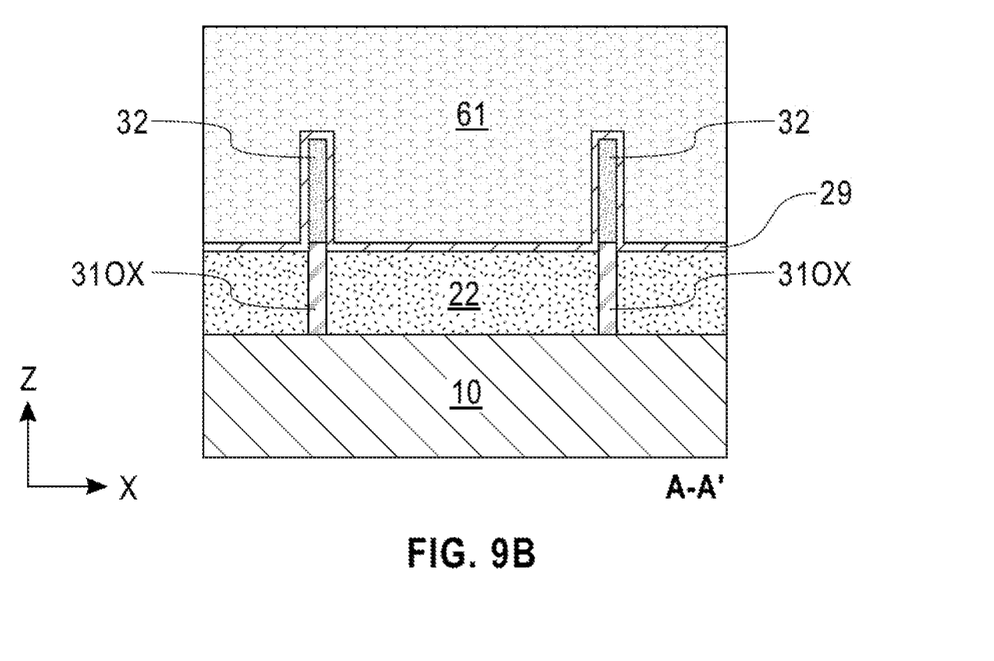
FIG. 9B is a schematic cross-sectional diagram of FIG. 9A taken along line A-A' according to an exemplary embodiment of the present invention.
Figure 10:
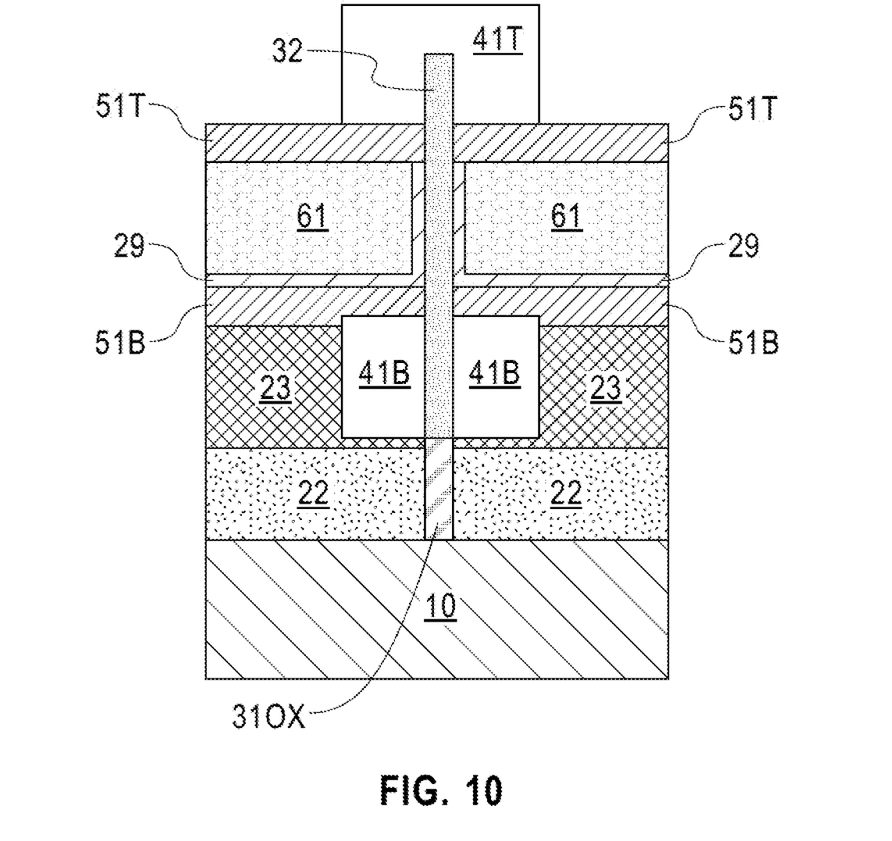
FIG. 10 is a schematic cross-sectional diagram representing a vertical transport FinFET formed from the semiconductor structure shown in FIG. 8 according to an exemplary embodiment of the present invention.

At block 180 of FIG. 1, the second dielectric layer 22 may be recessed to a level not higher than top surfaces of the plurality of oxidized first III-V semiconductor patterns 31OX. Referring to FIG. 8, FIG. 8 is a schematic perspective-view diagram representing the second dielectric layer 22 recessed to a level not higher than top surfaces of the plurality of oxidized first III-V semiconductor patterns 31OX according to an exemplary embodiment of the present invention. That is, the second dielectric layer 22 may be recessed to a fourth height H4 not higher than the oxidized second height H2OX of the plurality of oxidized first III-V semiconductor patterns 31OX. In other words, after the second dielectric layer 22 being recessed, the top surface of the second dielectric layer 22 is not higher than the top surfaces of the plurality of oxidized first III-V semiconductor patterns 31OX. When the second dielectric layer 22 is silicon oxide, the silicon oxide may be dry etched with etchants containing fluorine, such as: $CF_4$, and/or $CF_2/CH_2F_2$, or may be wet etched by hydrofluoric acid (DHF). The plurality of second III-V semiconductor patterns 32 of the plurality of fins protruding above the second dielectric layer 22 remain as active fins. Thus, a III-V semiconductor on insulator structure on semiconductor substrate is formed. Subsequently, source/drain structures and gate structures may be formed on the semiconductor structure around the plurality of second III-V semiconductor patterns 32 to form a plurality of fin field effect transistors (FinFETs). Due to the high electron mobility of the plurality of second III-V semiconductor patterns 32 and good insulating property to block current leakage path of the plurality of oxidized first III-V semiconductor patterns 31OX, the FinFETs formed may have superior electric properties. Regular FinFET is usually a lateral transport FinFET. Referring to FIGS. 9A and 9B, FIG. 9A is a schematic perspective-view diagram representing a lateral transport FinFET formed from the semiconductor structure shown in FIG. 8, and FIG. 9B is a schematic cross-sectional diagram of FIG. 9A taken along line A-A' according to an exemplary embodiment of the present invention. A gate 61 may be formed on the second dielectric layer 22, may extend in the first direction (X direction) crossing the plurality of fins, and may have spacers 51 on its sidewalls. A gate dielectric layer 29 may be formed on top and sidewalls of each of the plurality of fins protruding above the second dielectric layer 22 and also on top of the second dielectric layer 22. Source/drain structures 41 may be formed on each side of the gate 61. Suitable materials and processes may be used to form the lateral transport FinFET. For example, the gate 61 may include a work function metal and/or a conducting metal, the gate dielectric layer 29 may include an interfacial oxide and/or a high-k dielectric material, and the spacers 51 may include a nitride and/or an oxide, for example, silicon nitride, silicon borocarbonitride (SiBCN) or silicon oxycarbonitride (SiOCN). The source/drain structures 41 may be formed by an epitaxial growth process. A vertical transport FinFET may also be formed from the above described semiconductor structure. Referring to FIG. 10, FIG. 10 is a schematic cross-sectional diagram representing a vertical transport FinFET formed from the semiconductor structure shown in FIG. 8 according to an exemplary embodiment of the present invention. A third dielectric layer 23 may be formed on the second dielectric layer 22. The second and third dielectric layers 22 and 23 may include the same material. A bottom source/drain structure 41B may be formed in the third dielectric layer 23 and may surround a fin of the plurality of fins. A bottom spacer 51B may be formed on the bottom source/drain structure 41B. A gate 61, a top spacer 51T and a top source/drain structure 41T may be sequentially formed and stacked on the bottom spacer 51B in the third direction (Z direction). A gate dielectric layer 29 may be formed on the side wall of each of the plurality of fins and on the top surface of the bottom spacer 51B before the formation of the gate 61. In the vertical transport FinFET, the spacers 51 may include the top spacer 51T and the bottom spacer 51B, while the source/drain structures 41 may include the top source/drain structure 41T and the bottom source/drain structure 41B. In the above lateral and vertical transport FinFETs, each of the second semiconductor patterns 32 may function as a channel, and each of the gate structures may include the gate 61, the spacers 51 and the gate dielectric layer 29. In the lateral transport FinFET, the source/drain structures 41 and the gate structures may be formed to surround the plurality of fins and may be arranged in the second direction (Y direction), while in the vertical transport FinFET, the source/drain structures 41 and the gate structures may be formed to surround the plurality of fins and may be stacked in the third direction (Z direction).

Referring to the semiconductor structure shown in FIG. 8, FIG. 8 is a schematic perspective-view diagram representing the second dielectric layer 22 recessed to a level not higher than top surfaces of the plurality of oxidized first III-V semiconductor patterns 31OX according to an exemplary embodiment of the present invention. According to an exemplary embodiment of the present invention, there is provided a semiconductor structure including: a semiconductor substrate 10; a plurality of fins disposed on the semiconductor substrate 10, spaced apart in a first direction (X-direction) and extending in a second direction (Y direction) crossing the first direction (X direction), each of the plurality of fins vertically protruding in a third direction (Z direction) perpendicular to the first and second directions (X and Y directions), and including an oxidized first III-V semiconductor pattern 31OX and a second III-V semiconductor pattern 32 sequentially stacked on the semiconductor substrate 10; and a dielectric layer 22 formed over the semiconductor substrate 10 and surrounding the plurality of fins, in which top surface of the oxidized first III-V semiconductor pattern 31OX is not lower than top surface of the dielectric layer 22, and the oxidized first III-V semiconductor pattern 31OX includes aluminum oxide.

The semiconductor substrate 10 for the semiconductor structure may be any suitable substrate, and may include a semiconducting material such as, for example, silicon (Si), germanium (Ge), silicon germanium (SiGe), silicon carbide (SiC), gallium nitride (GaN) or gallium arsenide (GaAs), and a combination of semiconducting material and non-conducting material including multilayers, for example, germanium on silicon, germanium on insulator (GeOI) or silicon on insulator (SOI). The semiconductor substrate 10 can include one or more semiconductor layers or structures and can include active or operable portions of semiconductor devices. For some applications, the semiconductor substrate 10 may be doped with impurities to render them p-type or n-type. In a p-doped silicon substrate, the Si substrate may be doped with p-type dopants such as, for example, boron (B), aluminum (Al), gallium (Ga) and indium (In). In an n-doped silicon substrate, the Si substrate may be doped with n-type dopants such as, for example, antimony (Sb), arsenic (As) and phosphorous (P). The preferable substrate material for the semiconductor substrate 10 is silicon.

The plurality of fins may have a fin pitch in a range from about 10 nm to about 200 nm, and may each have a fin width in a range from about 5 nm to about 100 nm, a fin height in a range from about 20 nm to about 510 nm. The oxidized first III-V semiconductor pattern 31OX may have a height in a range from about 10 nm to about 500 nm. The dielectric layer 22 may have a thickness (height) in a range from about 10 nm to about 500 nm. The oxidized first III-V semiconductor pattern 31OX may be formed through a selective lateral wet oxidation process, and may include aluminum oxide ($Al_2O_3$). The semiconductor structure may be a III-V semiconductor on insulator structure on semiconductor substrate 10, in which the second III-V semiconductor pattern 32 as an active fin may include high crystal-quality III-V semiconductor material for high electron mobility, and the oxidized first III-V semiconductor pattern 31OX and the dielectric layer 22 as the insulator structure may provide high insulating property to reduce current leakage.

The oxidized first III-V semiconductor pattern 31OX before oxidation may include a first III-V semiconductor which includes aluminum. The first III-V semiconductor may include at least aluminum (Al), at least one of group V elements of nitrogen (N), phosphorus (P), arsenic (As), antimony (Sb) and bismuth (Bi), and optionally one or more other group III elements of boron (B), gallium (Ga), and indium (In). For example, the first III-V semiconductor may be a binary, ternary, or quaternary alloy including aluminium (Al). The binary alloy may be, for example, one of aluminum antimonide (AlSb), aluminum arsenide (AlAs), and aluminum phosphide (AlP). The ternary alloy may be, for example, one of aluminum gallium arsenide (AlGaAs), aluminum indium arsenide (AlInAs), aluminum indium antimonide (AlInSb), aluminum gallium antimonide (AlGaSb), aluminum gallium phosphide (AlGaP), aluminum indium phosphide (AlInP), aluminum gallium nitride (AlGaN), aluminum indium nitride (AlInN), aluminum arsenide antimonide (AlAsSb), aluminum arsenide phosphide (AlAsP), and aluminum phosphide antimonide (AlPSb). The quaternary alloy may be, for example one of aluminum gallium indium phosphide (AlGaInP), aluminum gallium arsenide phosphide (AlGaAsP), aluminum indium arsenide phosphide (AlInAsP), aluminum gallium arsenide antimonide (AlGaAsSb), aluminum gallium phosphide antimonide (AlGaPSb), aluminum indium gallium antimonide (AlInGaSb). Aluminum (Al) mole fraction may be in a range from about 50% to about 100% of group III component in the first III-V semiconductor. For example, for the aluminum arsenide (AlAs) or aluminum arsenide antimonide (AlAsSb), the Al mole fraction is 100% of the group III element. In aluminum gallium arsenide with formula $Al_xGa_{1-x}As$, the mole fraction x for Al may be about 0.5 (50%) or higher, but not 1 (100%). Due to variation in forming the ternary or quaternary alloy, here, about 0.5 may indicate a range from 0.47 to 0.53. Also, the mole fraction x for Al in $Al_xGa_{1-x}As$, may be very close to 1 (100%), such as $Al_{0.98}Ga_{0.02}As$ or $Al_{0.99}Ga_{0.01}As$. Similarly, in aluminum gallium arsenide phosphide with formula $Al_xGa_{1-x}AsP$, the mole fraction x for Al may be about 0.5 (50%) or higher, but not 1 (100%). Also, in aluminum gallium indium phosphide with formula $Al_xGa_yIn_{1-x-y}P$, the mole fraction x for Al may be about 0.5 (50%) or higher, but not 1 (100%). Aluminum (Al) mole fraction in a range from about 50% to about 100% of group III component in the first III-V semiconductor may allow easy oxidation and may render the oxidized first III-V semiconductor sufficiently insulating to alleviate current leakage. However, the present invention is not limited thereto. The Al mole fraction may be less than 50% as long as the oxidized III-V semiconductor is sufficiently insulating. For example, Al mole fraction may be in a range from about 35% to about 100% of group III component in the first III-V semiconductor.

The second III-V semiconductor pattern 32 may include a high crystal-quality second III-V semiconductor which includes at least one of group III elements of boron (B), gallium (Ga) and indium (In), and at least one of group V elements of nitrogen (N), phosphorus (P), arsenic (As), antimony (Sb) and bismuth (Bi). For example, the second III-V semiconductor may be a binary, ternary, or quaternary alloy including at least one of group III elements and at least one of group V elements. The binary alloy may be, for example, one of GaAs, GaN, GaP, InP, InAs, InSb, and GaSb. The ternary alloy may be, for example, one of InGaAs, InGaP, InGaSb, GaAsSb, InAsSb, GaAsP, and InGaN. The quaternary alloy may be, for example one of InAsSbP, GaInAsSb, and GaInPAs. The second III-V semiconductor may not include Al, or may include small amount of Al. If the Al is included in the second III-V semiconductor, the amount should be small enough that no significant oxidation would occur during the selective lateral wet oxidation of the first III-V semiconductor during the formation of the oxidized first III-V semiconductor pattern 31OX. The first III-V semiconductor has a first lattice, the second III-V semiconductor has a second lattice, and the first lattice matches the second lattice. For the lattice to match, both materials may have the same lattice constant or their lattice constants very close to each other. For example, AlAs, AlP, AlGaAs, AlInAs, AlAsSb and AlInP may be lattice matched to GaAs, GaP, GaAs, InGaAs, InP and GaAs, respectively. In an exemplary embodiment of the present invention, the oxidized first III-V semiconductor pattern 31OX before oxidation may include AlGaAs and the second III-V semiconductor pattern 32 may include GaAs, or the oxidized first III-V semiconductor pattern 31OX before oxidation may include AlInAs and the second III-V semiconductor pattern 32 may include InGaAs.

The dielectric layer 22 for the semiconductor structure may be formed as part of the insulator structure. The dielectric layer 22 may include tetraethyl orthosilicate (TEOS), silicon nitride ($Si_3N_4$), silicon oxide ($SiO_2$), silicon oxynitride (SiON), nanoporous silica, hydrogensilsesquioxanes (HSQ), Teflon-AF (polytetrafluoroethylene or PTFE), silicon oxyfluoride (FSG), carbon doped $SiO_2$ (SiCO), hydrogenated silicon oxycarbide (SiCOH), or other low k dielectric materials. The preferable material for the dielectric layer 22 is $SiO_2$.

Source/drain structures and gate structures may be formed on the semiconductor structure around the protruding parts of the plurality of fins to form FinFETs. Due to the high electron mobility of the second III-V semiconductor pattern 32 and good insulating property to block current leakage path of the oxidized first III-V semiconductor pattern 31OX, the FinFETs formed may have superior electric properties. The FinFETs may include a lateral transport FinFET as shown in FIGS. 9A and 9B. In the lateral transport FinFET, a gate 61 may be formed on the second dielectric layer 22, may extend in the first direction (X direction) crossing the plurality of fins, and may have spacers 51 on its sidewalls. A gate dielectric layer 29 may be formed on top and sidewalls of the plurality of fins protruding above the second dielectric layer 22 and also on top of the second dielectric layer 22. Source/drain structures 41 may be formed on each side of the gate 61. Any suitable materials may be used to form the lateral transport FinFET. For example, the gate 61 may include a work function metal and/or a conducting metal, the gate dielectric layer 29 may include an interfacial oxide and/or a high-k dielectric material, and the spacers 51 may include a nitride and/or an oxide, for example, silicon nitride, silicon borocarbonitride (SiBCN) or silicon oxycarbonitride (SiOCN). In addition, a vertical transport FinFET as shown in FIG. 10 may also be formed from the above described semiconductor structure. In the vertical transport FinFET, a third dielectric layer 23 may be formed on the second dielectric layer 22. The second and third dielectric layers 22 and 23 may include the same material. A bottom source/drain structure 41B may be formed in the third dielectric layer 23 and may surround a fin of the plurality of fins. A bottom spacer 51B may be formed on the bottom source/drain structure 41B. A gate 61, a top spacer 51T and a top source/drain structure 41T may be sequentially formed and stacked on the bottom spacer 51B. A gate dielectric layer 29 may be formed on the side wall of each of the plurality of fins and on the top surface of the bottom spacer 51B before the formation of the gate 61. In the above lateral and vertical transport FinFETs, each of the second semiconductor patterns 32 may function as a channel, and each of the gate structures may include the gate 61, the spacers 51 and the gate dielectric layer 29. In the lateral transport FinFET, the source/drain structures 41 and the gate structures may be disposed to surround the plurality of fins and may be arranged in the second direction (Y direction), while in the vertical transport FinFET, the source/drain structures 41 and the gate structures may be disposed to surround the plurality of fins and may be stacked in the third direction (Z direction).

As described above, exemplary embodiments of the present invention provide a method of forming a III-V semiconductor on insulator structure on semiconductor substrate, so that the active fins would have high crystal-quality III-V semiconductor material for high electron mobility and the insulator structure would have high insulating oxidized III-V semiconductor material including aluminum oxide to reduce current leakage, and also provide the III-V semiconductor on insulator structure on semiconductor substrate.

Although illustrative embodiments of the present invention have been described in detail, it should be understood that the present invention is not intended to be limited to the specific embodiments disclosed. Based on the foregoing disclosure, those skilled in the art will be able to make various changes, substitutions and alterations without departing from the spirit and scope of the present invention as defined by the following appended claims.

What is claimed is:

1. A semiconductor structure comprising:
   a semiconductor substrate;
   a plurality of fins disposed on the semiconductor substrate, spaced apart in a first direction and extending in a second direction crossing the first direction, each of the plurality of fins vertically protruding in a third direction perpendicular to the first and second directions, and comprising an oxidized first III-V semiconductor pattern and a second III-V semiconductor pattern sequentially stacked directly on the semiconductor substrate; and a dielectric layer formed directly on the semiconductor substrate and surrounding the plurality of fins, wherein top surface of the oxidized first III-V semiconductor pattern is not lower than top surface of the dielectric layer, and the oxidized first III-V semiconductor pattern comprises aluminum oxide distributed throughout an entirety of the oxidized first III-V semiconductor pattern, with the aluminum oxide being distributed to directly contact the semiconductor substrate, and together with the dielectric layer forms an insulator structure directly on the semiconductor substrate.

2. The semiconductor structure of claim 1, wherein the oxidized first III-V semiconductor pattern before oxidation comprises a first III-V semiconductor having a first lattice, the second III-V semiconductor pattern comprises a second III-V semiconductor having a second lattice, and the first lattice matches the second lattice.

3. The semiconductor structure of claim 2, wherein the first III-V semiconductor is aluminum gallium arsenide (AlGaAs) and the second III-V semiconductor is gallium arsenide (GaAs), or the first III-V semiconductor is aluminum indium arsenide (AlInAs) and the second III-V semiconductor is indium gallium arsenide (InGaAs).

4. The semiconductor structure of claim 2, wherein the first III-V semiconductor comprises one of aluminum antimonide (AlSb), aluminum arsenide (AlAs), aluminum phosphide (AlP), aluminum gallium arsenide (AlGaAs), aluminum indium arsenide (AlInAs), aluminum indium antimonide (AlInSb), aluminum gallium antimonide (AlGaSb), aluminum gallium phosphide (AlGaP), aluminum indium phosphide (AlInP), aluminum gallium nitride (AlGaN), aluminum indium nitride (AlInN), aluminum arsenide antimonide (AlAsSb), aluminum arsenide phosphide (AlAsP), aluminum phosphide antimonide (AlPSb), aluminum gallium indium phosphide (AlGaInP), aluminum gallium arsenide phosphide (AlGaAsP), aluminum indium arsenide phosphide (AlInAsP), aluminum gallium arsenide antimonide (AlGaAsSb), aluminum gallium phosphide antimonide (AlGaPSb), aluminum indium gallium antimonide (AlInGaSb) and combinations thereof.

5. The semiconductor structure of claim 1, wherein the oxidized first III-V semiconductor pattern comprises an oxidized first III-V semiconductor having aluminum mole fraction in a range from about 50% to about 100% of group III component of the oxidized first III-V semiconductor.

6. The semiconductor structure of claim 1, wherein the semiconductor substrate is a silicon substrate or a silicon on insulator substrate.

7. The semiconductor structure of claim 1, wherein a height in the third direction of the oxidized first III-V semiconductor is about 10 nm or higher.

8. The semiconductor structure of claim 1 further comprising source/drain structures and gate structures, which are disposed on the dielectric layer, surrounding the plurality of fins, and arranged in the second direction to form lateral transport FinFETs, or are disposed on the dielectric layer, surrounding the plurality of fins, and stacked in the third direction to form vertical transport FinFETs.

* * * * *